US007046055B2

United States Patent
Lee et al.

(10) Patent No.: US 7,046,055 B2
(45) Date of Patent: May 16, 2006

(54) VOLTAGE DETECTION CIRCUIT

(75) Inventors: Chao-Chi Lee, Taipei (TW); Yu-Tong Lin, Taichung (TW); Chih-Fu Chien, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/250,733

(22) Filed: Oct. 14, 2005

(65) Prior Publication Data

US 2006/0033540 A1   Feb. 16, 2006

Related U.S. Application Data

(62) Division of application No. 10/876,079, filed on Jun. 24, 2004.

(51) Int. Cl.
*H03L 7/00* (2006.01)

(52) U.S. Cl. .................. 327/143; 327/198; 327/513
(58) Field of Classification Search ................. 327/72, 327/81, 82, 143, 198, 513

See application file for complete search history.

(56) References Cited

U.S. PATENT DOCUMENTS

| 5,336,943 | A | * | 8/1994 | Kelly et al. | ................. 327/513 |
| 6,429,700 | B1 | * | 8/2002 | Yang | .......................... 327/108 |
| 6,559,629 | B1 | * | 5/2003 | Fernald | ...................... 323/313 |
| 6,765,431 | B1 | * | 7/2004 | Coady | ......................... 327/539 |
| 6,906,590 | B1 | * | 6/2005 | Amano | ....................... 330/277 |
| 2004/0080305 | A1 | * | 4/2004 | Lin et al. | .................... 323/312 |

* cited by examiner

*Primary Examiner*—Terry D. Cunningham
*Assistant Examiner*—Thomas J. Hiltunen
(74) *Attorney, Agent, or Firm*—Winston Hsu (57) ABSTRACT

A voltage detection circuit for detecting the voltage level of a first power source. A first transistor includes a first gate, a first source, and a first drain coupled to the first gate. A second transistor includes a second gate, a second source, and a second drain coupled to the second gate. A comparator includes a first input terminal, a second input terminal coupled to the second drain, and an output terminal. A first resistor is coupled between the first input terminal and the first drain. A second resistor is coupled to the first power source. A third resistor is coupled between the second resistor and the first input terminal. A fourth resistor is coupled between the second resistor and input terminal. A fifth resistor is coupled between the first source, and a second power source. A resistive device is coupled between the first source, and the first power source.

10 Claims, 6 Drawing Sheets

VOLTAGE DETECTION CIRCUIT

CROSS-REFERENCE TO RELATED APPLICATION

This application is a divisional of U.S. patent application Ser. No. 10/876,079, filed Jun. 24, 2004.

BACKGROUND

The present disclosure relates in general to a voltage detection circuit. In particular, the present disclosure relates to a voltage detection circuit for power-on detection with temperature compensation.

Figure 1:
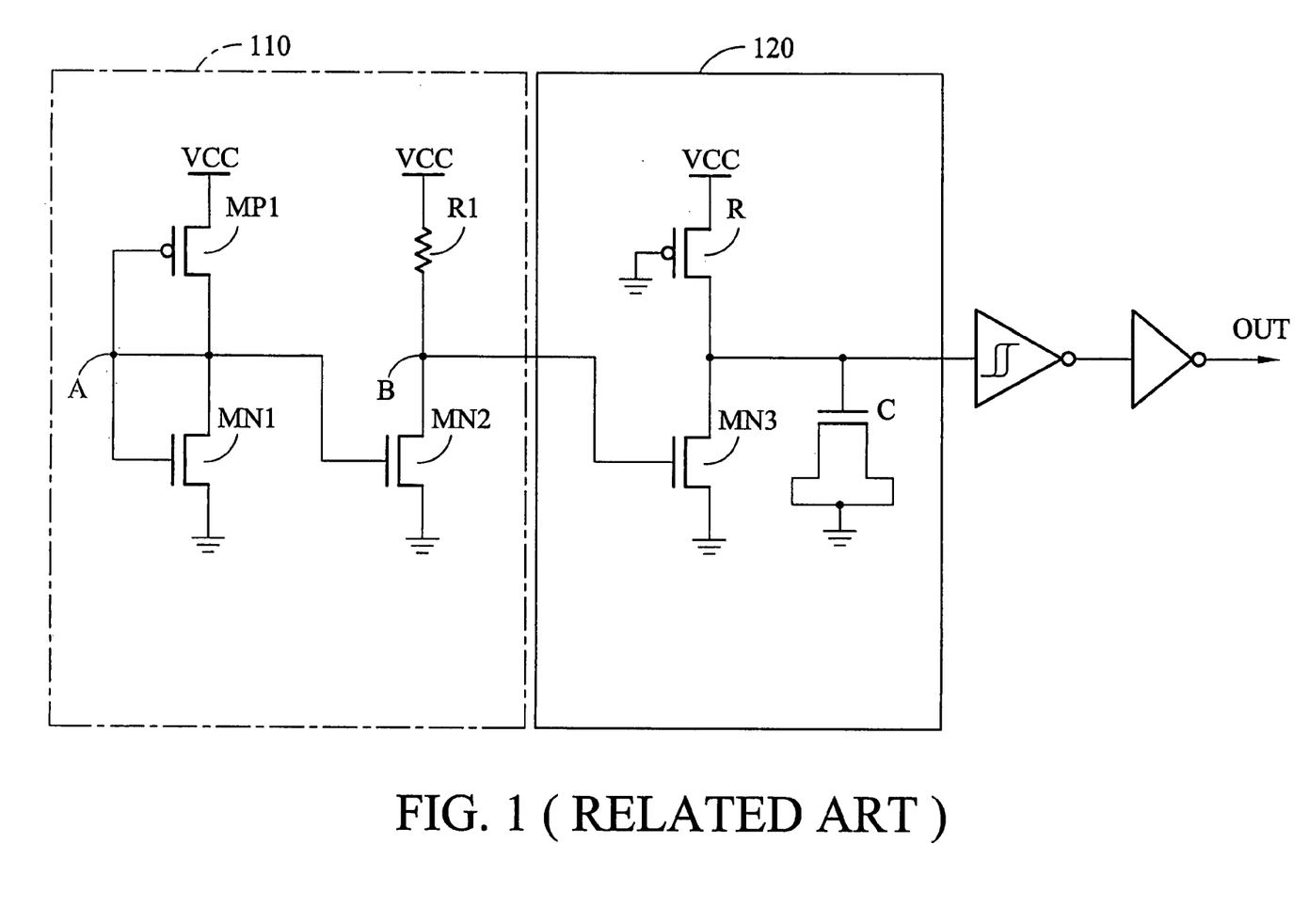
FIG. 1 shows a circuit diagram of a convention power-on detection circuit.

FIG. 1 shows a circuit diagram of a conventional power-on detection circuit. The power-on detection circuit 100 comprises a voltage detection circuit 110 and a RC-filter 120.

The voltage detection circuit 110 comprises a PMOS transistor MP1, NMOS transistors MN1, MN2, and a resistor R1. The NMOS transistor MN1 and PMOS MP1 transistor comprise a voltage reference circuit. The drain and gate of the PMOS transistor MP1 are both coupled to node A, to which the drain and gate of the NMOS transistor MN1 are both coupled. The node A is coupled to the gate of the NMOS transistor MN2. Resistor R1 is coupled between the drain of the NMOS transistor MN2 and the voltage source VCC.

The PMOS transistors MP1 and the NMOS transistor MN1 from a voltage divider to generate a reference voltage at node A. The reference voltage is determined by threshold voltages Vthn1 and Vthp1 of the NMOS transistor MN1 and of the PMOS transistor MP1 respectively. The NMOS transistor MN2 is configured as a common-source with a passive load R1 for outputting the detecting result at node B.

At power-on, voltage source VCC is increased from 0V. Thus, the voltage level of node A is lower than the threshold voltage Vthn2 of NMOS transistor MN2. Therefore, NMOS transistor MN2 is turned off, NMOS transistor MN3 is turned on, and output terminal OUT of inverter 130 is low. When voltage source VCC reaches a predetermined value causing the voltage level of node A exceed the threshold voltage Vthn2 of NMOS transistor MN2, NMOS transistor MN2 is turned on and NMOS transistor MN3 is turned off. Thus, output terminal OUT of inverter 130 is at high voltage after a RC delay period.

When the process or temperature induce variations in the threshold voltage Vthn2 of the NMOS transistor MN2, the threshold voltage Vthn1 of the NMOS transistor MN1 varies correspondingly. Thus, the reference voltage corresponds to the threshold voltage Vthn1 of the NMOS transistor MN1. When the voltage VCC remains the same, the variation of the reference voltage compensates for the variation in the threshold voltage Vthn2 of the NMOS transistor MN2. Therefore, the voltage of node B remains constant without suffering from the variation of the threshold voltage Vthn.

However, the voltage detection of the power-on detection circuit 100 is imprecise when the voltage source VCC is scaled down by the advance process. Due to the variation of threshold voltages Vthn1, Vthn2 and Vthp not scaled down with process, variations of the detected voltage are very large and voltage overhead may result.

Figure 2:
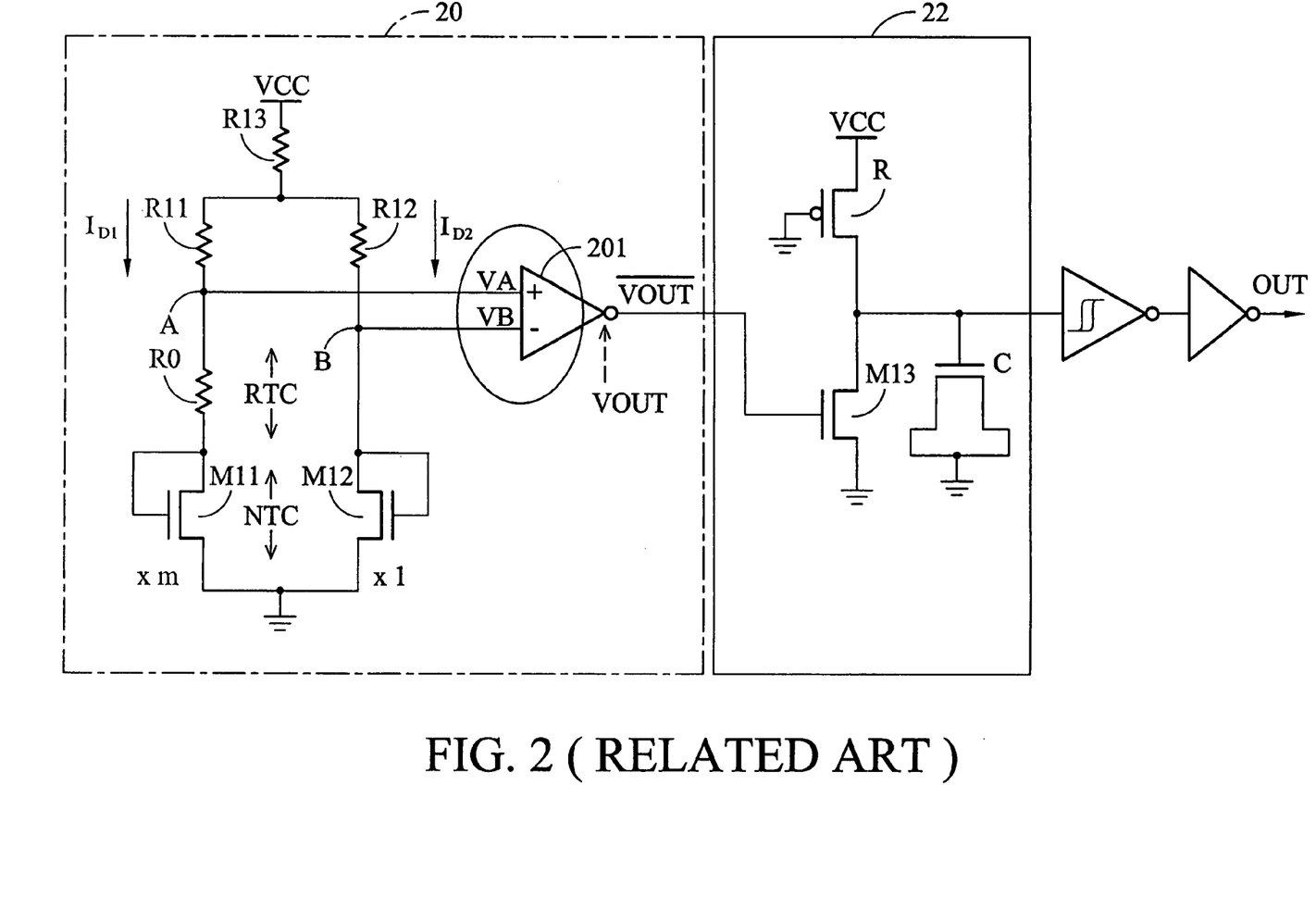
FIG. 2 shows another conventional power-on detection circuit.

FIG. 2 shows another conventional power-on detection circuit. The power-on detection circuit comprises a voltage detection circuit 20 and a RC-filter 22. The gate of NMOS transistor M11 is connected to its drain. The gate of NMOS transistor M12 is connected to its drain at node B. The sources of NMOS transistors M11 and M12 are connected to ground. In addition, the aspect ratio of the NMOS transistor MN11 is N times larger than that of the NMOS transistor MN12. Thus, N numbers of NMOS transistors connected in parallel comprise the NMOS transistor MN11.

Comparator 201 comprises a first input terminal connected to node A, a second input terminal connected to node B, and output terminal VOUT. The voltage level of node A is voltage VA, and that of node B is voltage VB. Comparator outputs low voltage when voltage VA is lower than voltage VB, and outputs high voltage when voltage VA exceeds voltage VB.

Resistor R0 is connected between node A and the gate and drain of the NMOS transistor M11. Resistor R13 is connected to the power source VCC. Resistor R11 is connected between node A and resistor R13. Resistor R12 is connected between node B and resistor R13.

During the power-on process, the voltage source VCC is initially increased from 0V, before reaching a predetermined voltage level $V_{rr}$, voltage VA is lower than the voltage VB, and the output terminal VOUT of the comparator 201 is at low level. Until the voltage source VCC rises to the predetermined voltage level $V_{rr}$, the output terminal VOUT of the comparator 201 is at high level margin.

When the voltage source VCC reaches the predetermined voltage level $V_{rr}$, the voltage VA is equal to voltage VB. At this time, comparator 201 detects the voltage VA and VB, and its output terminal VOUT transitions from low level to high level. Subsequently, the voltage VA exceeds the voltage VB. Thus, the output terminal VOUT of the comparator 201 is at high level margin. Thus, NMOS transistor M13 is turned on by the comparator 201, and output terminal OUT is at a high voltage after a RC delay period.

Equation (1) describes the drain current $I_D$ of a MOS transistor.

$$I_D = \mu_n C_d \frac{W}{L} V_T^2 \left( \exp \frac{V_{GS} - V_{TH}}{\zeta V_T} \right) \cdot \left( 1 - \exp \frac{-V_{DS}}{V_T} \right) \quad (1)$$

$$\cong \mu_n C_d \frac{W}{L} V_T^2 \left( \exp \frac{V_{GS} - V_{TH}}{\zeta V_T} \right)$$

$$= A \mu_n V_T^2 \left( \exp \frac{V_{GS} - V_{TH}}{\zeta V_T} \right)$$

where $$V_T \equiv \frac{KT}{q}; \zeta \equiv 1 + \frac{C_d}{C_{OX}}; A \propto \frac{W}{L}$$

Let $V_{GS} - V_{TH} = V_{OV}$, thus:

$$V_{OV} = \zeta V_T [\ln(I_D) - \ln(A \mu_n V_T^2)] \quad (2)$$

According equation (2), $V_{GS1}$ and $V_{GS2}$ respectively of NMOS transistors M11 and M22 are:

$$V_{GS1} = V_{OV1} + V_{TH} = \zeta V_T [\ln(I_{D1}) - \ln(A \mu_n V_T^2)] + V_{TH} \quad (3)$$

$$V_{GS2} = V_{OV2} + V_{TH} \quad (4)$$

$$= \zeta V_T \left[ \ln \left( I_{D1} \cdot m \cdot \frac{R11}{R12} \right) - \ln(A \mu_n V_T^2) \right] + V_{TH}$$

As mentioned, the voltage VA is equal to voltage VB when the voltage source VCC reaches the predetermined voltage level $V_{rr}$. Thus, the voltage difference $\Delta V_{OV}$ across resistor R0 is:

$$V_{GS1} - V_{GS2} = V_{OV1} - V_{OV2} = \Delta V_{OV} = \zeta V_T \ln\left(m \cdot \frac{R11}{R12}\right) \quad (5)$$

Thus, the voltage difference $\Delta V_{OV}$ is increased incrementally as temperature increases. In addition, NMOS transistors M11 and M12 are biased in the sub-threshold region, such that the threshold voltage $V_{TH}$ NMOS transistors M11 and M12 are decreased incrementally as temperature increases, which are the voltage difference between the drain and the source of the NMOS transistors M11 and that of NMOS transistors M12 respectively.

When the voltage VCC remains at $V_{rr}$ and the variation of temperature, the variation of voltage difference $\Delta V_{OV}$ compensates for the variation of the voltage difference between the drain and the source of the NMOS transistors M11 and M12.

In addition, when the voltage VA is equal to voltage VB, the voltage level $V_{rr}$ is:

$$V_{rr} = V_{OV1} + V_{TH} + \left(\frac{\Delta V_{OV}}{R0}\right)(R11 + R0) + \quad (6)$$

$$\left(\frac{\Delta V_{OV}}{R0}\right)\left(1 + \frac{R12}{R11}\right)R13$$

$$= V_{OV1} + V_{TH} + \left(\frac{\Delta V_{OV}}{R0}\right)\left[(R11 + R0) + \left(1 + \frac{R12}{R11}\right)R13\right]$$

According to equations (1) and (5), the voltage difference $\Delta V_{OV}$ and current $I_{D1}$ and $I_{D2}$ are increased incrementally as temperature increases. In addition, $V_{OV1}$ is increased with the increased current $I_{D1}$. Thus, the first term ($V_{OV1}$) and third term of equation (6) have a positive temperature coefficient (PTC), and the second term ($V_{TH}$) of equation (6) has a negative temperature coefficient (NTC) and a fixed factor. Thus, a adjustable voltage level $V_{rr}$ with temperature compensation is unable obtained.

SUMMARY

One object, among others, of the present invention is thus to provide a voltage detection circuit, comprising the voltage level $V_{rr}$ making voltage VA equal to voltage VB has a negative temperature coefficient turn with adjusted factor as shown in equation (7).

$$Vrr = E(NTC) + F(PTC) \quad (7)$$

Thus, a desired voltage level $V_{rr}$ with temperature compensation is obtained by changing the factors E and F.

To achieve the above-mentioned object, the present invention provides a voltage detection circuit for detecting the voltage level of a first power source. A first MOS transistor includes a first gate, a first source, and a first drain coupled to the first gate. A second MOS transistor includes a second gate, a second source, and a second drain coupled to the second gate. A comparator includes a first input terminal, a second input terminal coupled to the second drain, and an output terminal. A first resistor is coupled between the first input terminal and the first drain. A second resistor is coupled to the first power source. A third resistor is coupled between the second resistor and the first input terminal. A fourth resistor is coupled between the second resistor and the second input terminal. A fifth resistor is coupled between a connection point of the first source and the second source, and a second power source. A resistive device is coupled between the connection point of the first source and the second source, and the first power source.

In addition, some embodiments of the present invention provide a voltage detection circuit for detecting the voltage level of a first power source. A first MOS transistor includes a first gate, a first source, and a first drain coupled to the first gate. A second MOS transistor includes a second gate, a second source, and a second drain coupled to the second gate. A comparator includes a first input terminal, a second input terminal coupled to the second drain, and an output terminal. A first resistor is coupled between the first input terminal and the first drain. A second resistor is coupled to the first power source. A third resistor is coupled between the second resistor and the first input terminal. A fourth resistor is coupled between the second resistor and the second input terminal. A fifth resistor is coupled between a connection point of the first source and the second source, and a second power source. A positive temperature coefficient device is coupled to the fifth resistor in parallel. The current passing through the positive temperature coefficient device is increased incrementally as temperature increases.

BRIEF DESCRIPTION OF THE DRAWINGS

Various aspects of the present invention will become more fully understood from the detailed description, given hereinbelow, and the accompanying drawings. The drawings and description are provided for purposes of illustration only and, thus, are not intended to be limiting of the present invention.

DETAILED DESCRIPTION

First Embodiment

Figure 3:
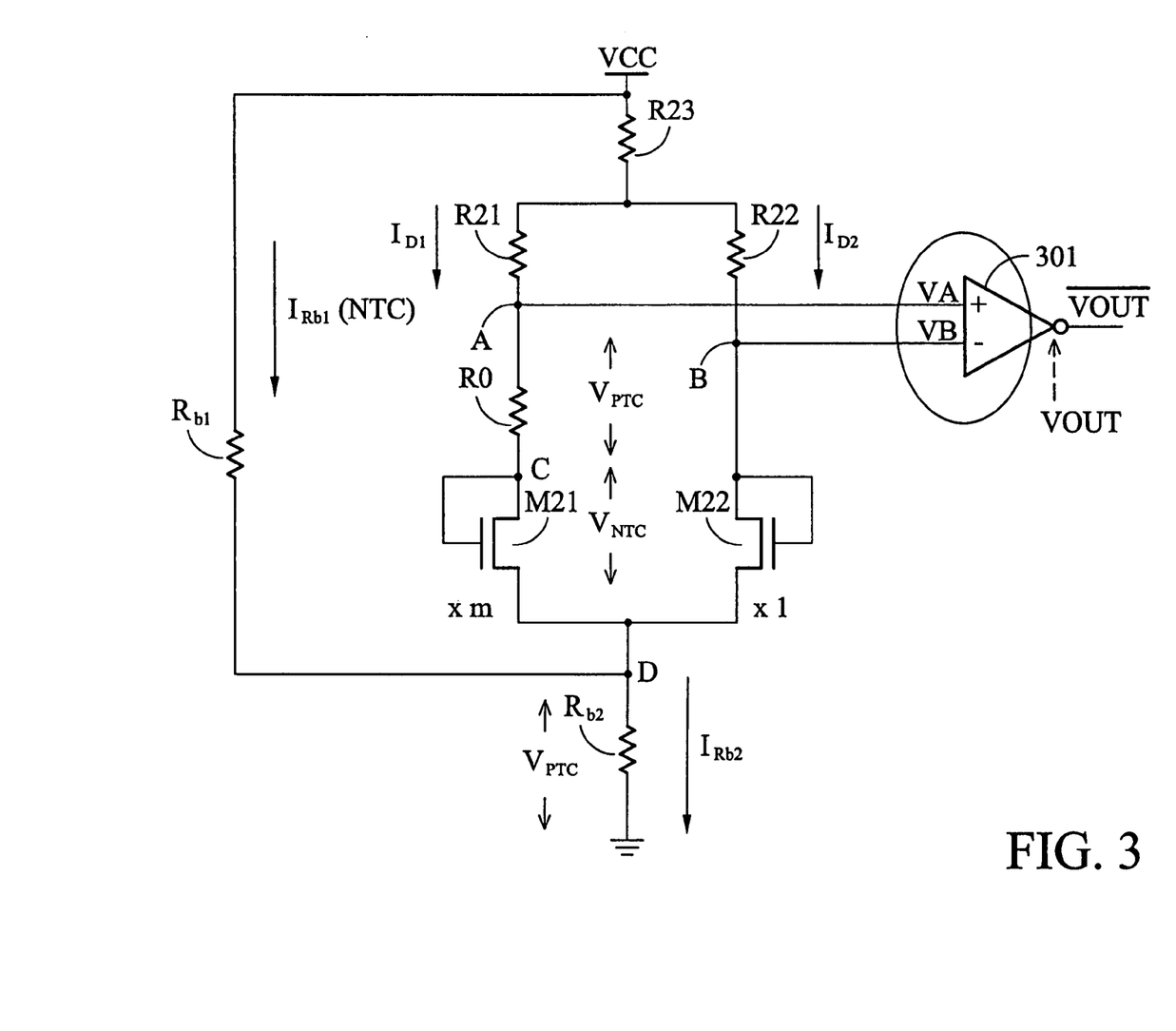
FIG. 3 shows a voltage detection circuit according to the first embodiment of the present invention.

In the first embodiment, an electrical device is added to the voltage detection circuit to generate a current $I_{NTC}$ with negative temperature coefficient (NTC). After the current $I_{NTC}$ passes through a resistor $R_b$, a voltage difference across the resistor $R_b$ with negative temperature coefficient (NTC) is obtained.

FIG. 3 shows a voltage detection circuit according to the first embodiment of the present invention. The gate of NMOS transistor M21 is connected to its drain. The gate of NMOS transistor M22 is connected to its drain at node B. The sources of NMOS transistors M21 and M22 are connected to node D. In addition, the aspect ratio of the NMOS transistor MN21 is N times larger than that of the NMOS transistor MN22. Thus, N number of NMOS transistors connected in parallel comprise the NMOS transistor MN21.

Comparator 301 comprises a first input terminal connected to node A, a second input terminal connected to node B, and output terminal VOUT. The voltage level of node A is voltage VA, and that of node B is voltage VB. Comparator outputs (VOUT) low voltage when voltage VA is lower than voltage VB, and outputs high voltage when voltage VA exceeds voltage VB.

Resistor R0 is connected between node A and the connection point C of the gate and the drain of the NMOS transistor M21. Resistor R23 is connected to the power source VCC. Resistor R21 is connected between node A and resistor R23. Resistor R22 is connected between node B and resistor R23. In addition, resistor $R_{b2}$ is connected between node D and ground. A negative temperature coefficient current $I_{Rb1}$ flows through resistor $R_{b2}$.

When the voltage source VCC is initially increased from 0V, before reaching a predetermined voltage level $V_{rr}$, voltage VA is lower than the voltage VB, and the output terminal VOUT of the comparator 301 is at low level. Until the voltage source VCC rises to the predetermined voltage level $V_{rr}$, the output terminal VOUT of the comparator 301 is at high level margin.

When the voltage source VCC just reaches the predetermined voltage level $V_{rr}$, the voltage VA is equal to voltage VB. At this time, comparator 301 detects the voltage VA and VB, and its output terminal VOUT transitions from low to high level. Subsequently, the voltage VA exceeds the voltage VB. Thus, the output terminal VOUT of the comparator 301 is at high level margin.

In addition, when the voltage VA is equal to voltage VB, the voltage level $V_{rr}$ is:

$$V_{rr} = V_{OV1} + V_{TH} + \left(\frac{\Delta V_{OV}}{R0}\right)(R21 + R0) + \qquad (8)$$

$$\left(\frac{\Delta V_{OV}}{R0}\right)\left(1 + \frac{R22}{R21}\right)R23 + \left(\frac{\Delta V_{OV}}{R0}\right)\left(1 + \frac{R22}{R21}\right)R_{b2} +$$

$$\frac{V_{OV1} + V_{TH} + \left(\frac{\Delta V_{OV}}{R0}\right)(R21 + R0) + \left(\frac{\Delta V_{OV}}{R0}\right)\left(1 + \frac{R22}{R21}\right)R23}{R_{b1}} \cdot R_{b2}$$

$$= \left(1 + \frac{R_{b2}}{R_{b1}}\right)V_{OV1} + \left(1 + \frac{R_{b2}}{R_{b1}}\right)V_{TH} + \left(1 + \frac{R_{b2}}{R_{b1}}\right)\left(\frac{\Delta V_{OV}}{R0}\right)$$

$$\left[(R21 + R0) + \left(1 + \frac{R22}{R21}\right)R23\right] + \left(\frac{\Delta V_{OV}}{R0}\right)\left(1 + \frac{R22}{R21}\right)R_{b2}$$

$$= \left(1 + \frac{R_{b2}}{R_{b1}}\right)V_{OV1} + \left(1 + \frac{R_{b2}}{R_{b1}}\right)V_{TH} + \left(\frac{\Delta V_{OV}}{R0}\right)\left\{\left(1 + \frac{R_{b2}}{R_{b1}}\right)\right.$$

$$\left.\left[(R21 + R0) + \left(1 + \frac{R22}{R21}\right)R23\right] + \left(1 + \frac{R22}{R21}\right)R_{b2}\right\}$$

Here, the voltage detection circuit of the first embodiment is designed to make the voltage level of node D increased incrementally as temperature increases. Thus, when temperature is increased, the voltage difference across resistor $R_{b1}$ is decreased, thus current $I_{Rb1}$ has a negative temperature coefficient (NTC). Thus, current $I_{Rb1}$ generates a voltage difference across resistor $R_{b2}$ with negative temperature coefficient.

According to equations (1) and (8), the voltage difference $\Delta V_{OV}$ and current $I_{D1}$ and $I_{D2}$ are increased incrementally as temperature increases. In addition, $V_{OV1}$ is increased with the increased current $I_{D1}$. Thus, the first term ($V_{OV1}$) and third term of equation (8) have a positive temperature coefficient (PTC), and the second term ($V_{TH}$) of equation (6) has a negative temperature coefficient (NTC). Here, the NTC term ($V_{TH}$) of equation (8) is adjustable by changing resistors $R_{b1}$ and $R_{b2}$. Thus, a desired voltage level $V_{rr}$ with temperature compensation is obtained.

Second Embodiment

Figure 4:
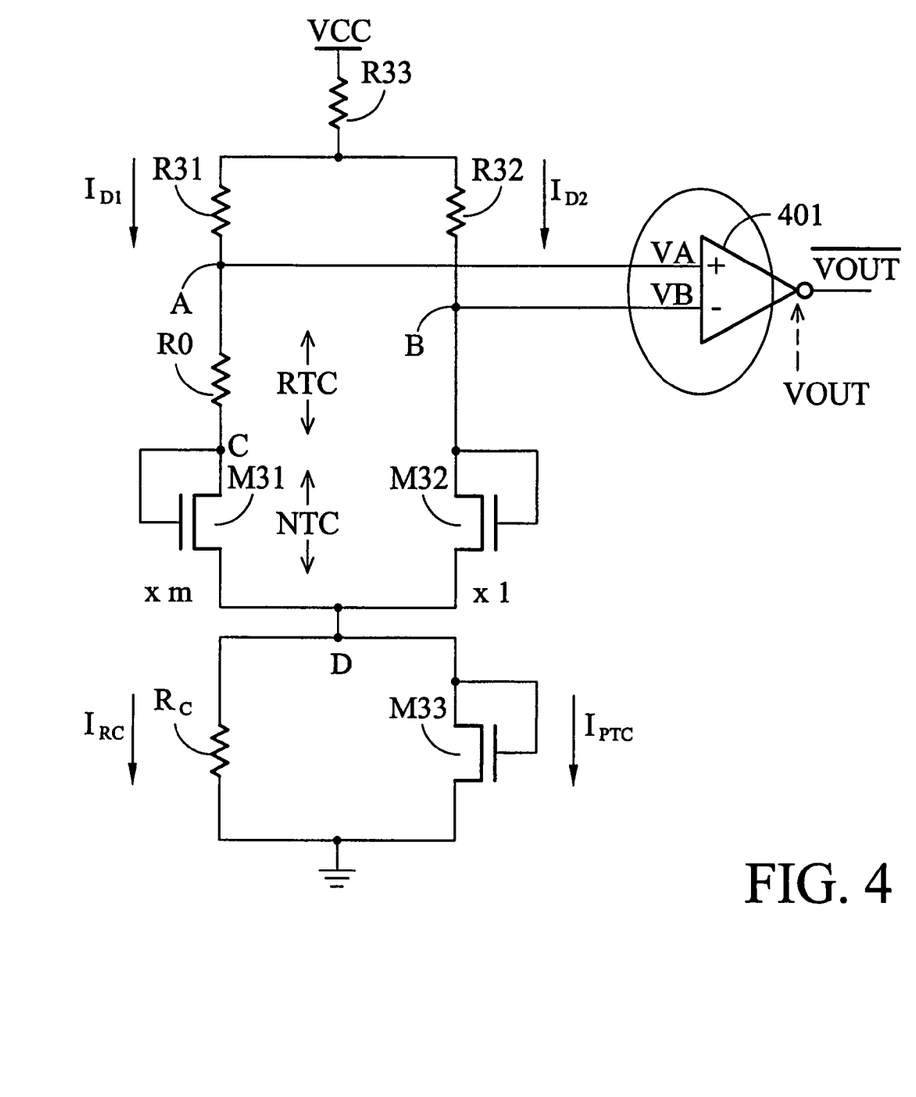
FIG. 4 shows a voltage detection circuit according to the second embodiment of the present invention.

In the second embodiment, an electrical device is added to the voltage detection circuit and is connected to resistor $R_c$ in parallel, generating a current $I_{PTC}$ with positive temperature coefficient (PTC). When temperature is increased, the current $I_{PTC}$ increases and a relative decreasing current through resistor $R_c$ is generated.

FIG. 4 shows a voltage detection circuit according to the second embodiment of the present invention. The gate of NMOS transistor M31 is connected to its drain. The gate of NMOS transistor M32 is connected to its drain at node B. The sources of NMOS transistors M31 and M32 are connected to node D. In addition, the aspect ratio of the NMOS transistor MN31 is N times larger than that of the NMOS transistor MN32. Thus, N number of NMOS transistors connected in parallel comprise the NMOS transistor MN31.

Comparator 401 comprises a first input terminal connected to node A, a second input terminal connected to node B, and output terminal VOUT. The voltage level of node A is voltage VA, and that of node B is voltage VB. Comparator outputs low voltage level when voltage VA is lower than voltage VB, and outputs high voltage level when voltage VA exceeds voltage VB.

Resistor R0 is connected between node A and the connection point C of the gate and the drain of the NMOS transistor M31. Resistor R33 is connected to the power source VCC. Resistor R31 is connected between node A and resistor R33. Resistor R32 is connected between node B and resistor R33. In addition, resistor $R_c$ is connected between node D and ground. A positive temperature coefficient current $I_{PTC}$ flows through NMOS transistor M33.

When the voltage source VCC is initially increased from 0V, before reaching a predetermined voltage level $V_{rr}$, voltage VA is lower than the voltage VB, and the output terminal VOUT of the comparator 401 is at low level. Until the voltage source VCC rises to the predetermined voltage level $V_{rr}$, the output terminal VOUT of the comparator 401 is at high level margin.

When the voltage source VCC just reaches the predetermined voltage level $V_{rr}$, the voltage VA is equal to voltage VB. At this time, comparator 401 detects the voltage VA and VB, and its output terminal VOUT has a transition from low level to high level. Subsequently, the voltage VA exceeds the voltage VB. Thus, the output terminal VOUT of the comparator 401 is at high level margin.

In addition, when the voltage VA is equal to voltage VB, the voltage level $V_{rr}$ is:

$$V_{rr} = V_{OV1} + V_{TH} + \left(\frac{\Delta V_{OV}}{R0}\right)(R31 + R0) + \qquad (9)$$

$$\left(\frac{\Delta V_{OV}}{R0}\right)\left(1 + \frac{R32}{R31}\right)R33 + \left[\left(\frac{\Delta V_{OV}}{R0}\right)\left(1 + \frac{R32}{R31}\right) - I_{PTC}\right]R_c$$

$$= V_{OV1} + V_{TH} +$$

$$\left(\frac{\Delta V_{OV}}{R0}\right)\left[(R31 + R0) + \left(1 + \frac{R32}{R31}\right)(R33 + R_c)\right] -$$

$$\mu_n C_d \frac{W}{L} V_T^2 \left(\exp\frac{V_{GS3} - V_{Th}}{\zeta V_T}\right) R_c$$

Here, the voltage detection circuit of the second embodiment is designed to make the voltage level of node D increased incrementally as temperature increases. Thus, when temperature is increased, voltage difference across resistor $R_c$ is increased. In addition, the gate-to-source voltage $V_{GS3}$ of NMOS transistor M33 is also increased.

Thus, current $I_{PTC}$ is increased incrementally as temperature increases. Therefore, a relative part of decreasing current is generated, such as generates a part of voltage difference across resistor $R_c$ with negative temperature coefficient.

According to equations (1) and (9), the voltage difference $\Delta V_{OV}$ and current $I_{D1}$ and $I_{D2}$ are increased incrementally as temperature increases. In addition, $V_{OV1}$ is increased with increased current $I_{D1}$. Thus, the first term ($V_{OV1}$) and third term of equation (9) have a positive temperature coefficient (PTC), and the second term ($V_{TH}$) of equation (6) has a negative temperature coefficient (NTC). In addition, the fourth term of equation (9) also has a positive temperature coefficient (PTC). Thus, a desired voltage level $V_{rr}$ with temperature compensation is obtained.

Figure 5:
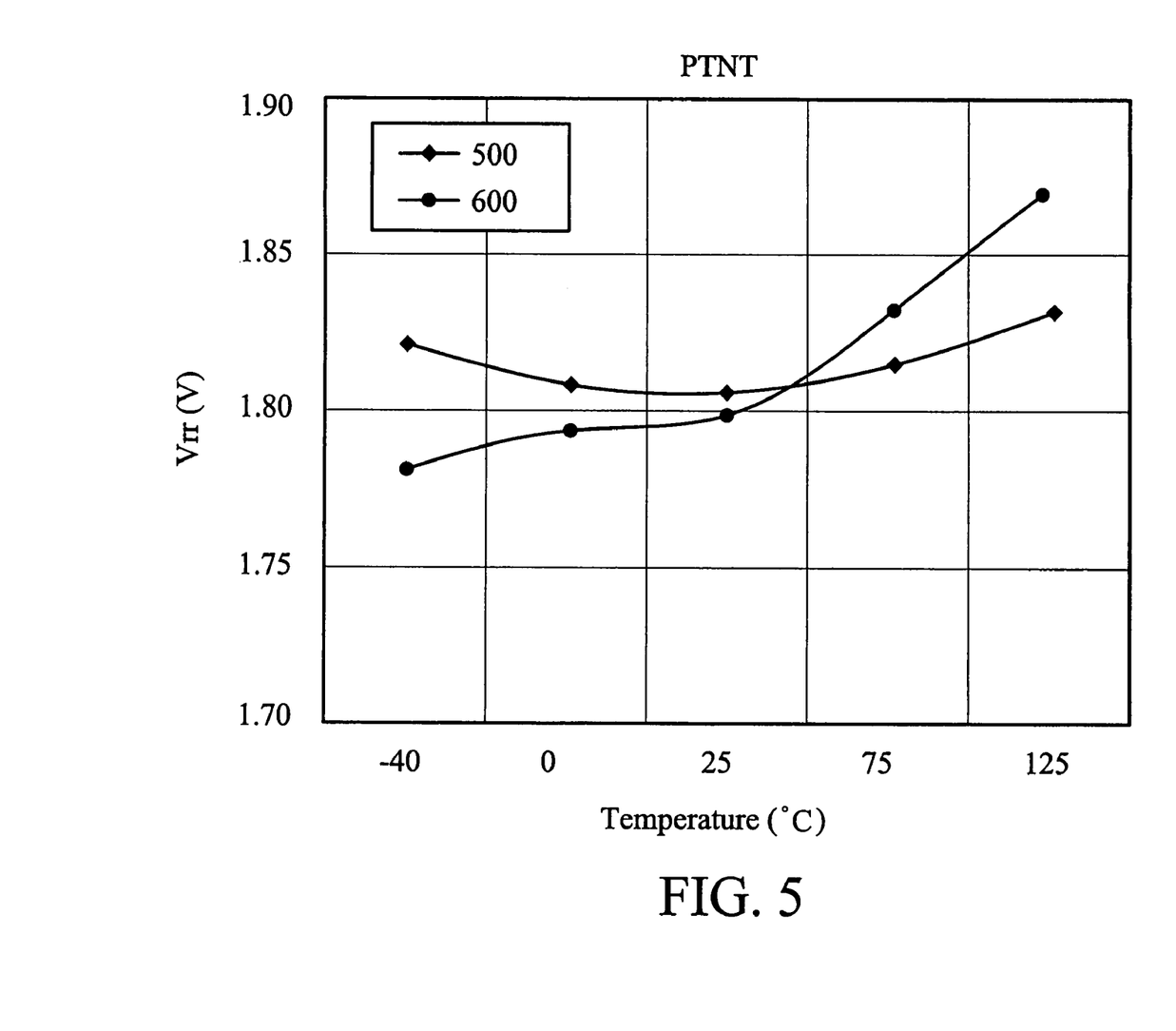
FIG. 5 shows a diagram of detecting voltages versus temperature variations.

FIG. 5 shows a diagram of detected voltages versus temperature variations. The temperature varies from −40° C. to 125° C. As shown in FIG. 5, the curve 500 and 600 represents the detected voltage Vrr of the voltage detection circuit shown in FIG. 2 and that of the embodiments of the present invention, respectively. The voltage detection circuit according to the embodiments of the present invention has a temperature coefficient much lower than that of the conventional voltage detection circuit.

Figure 6:
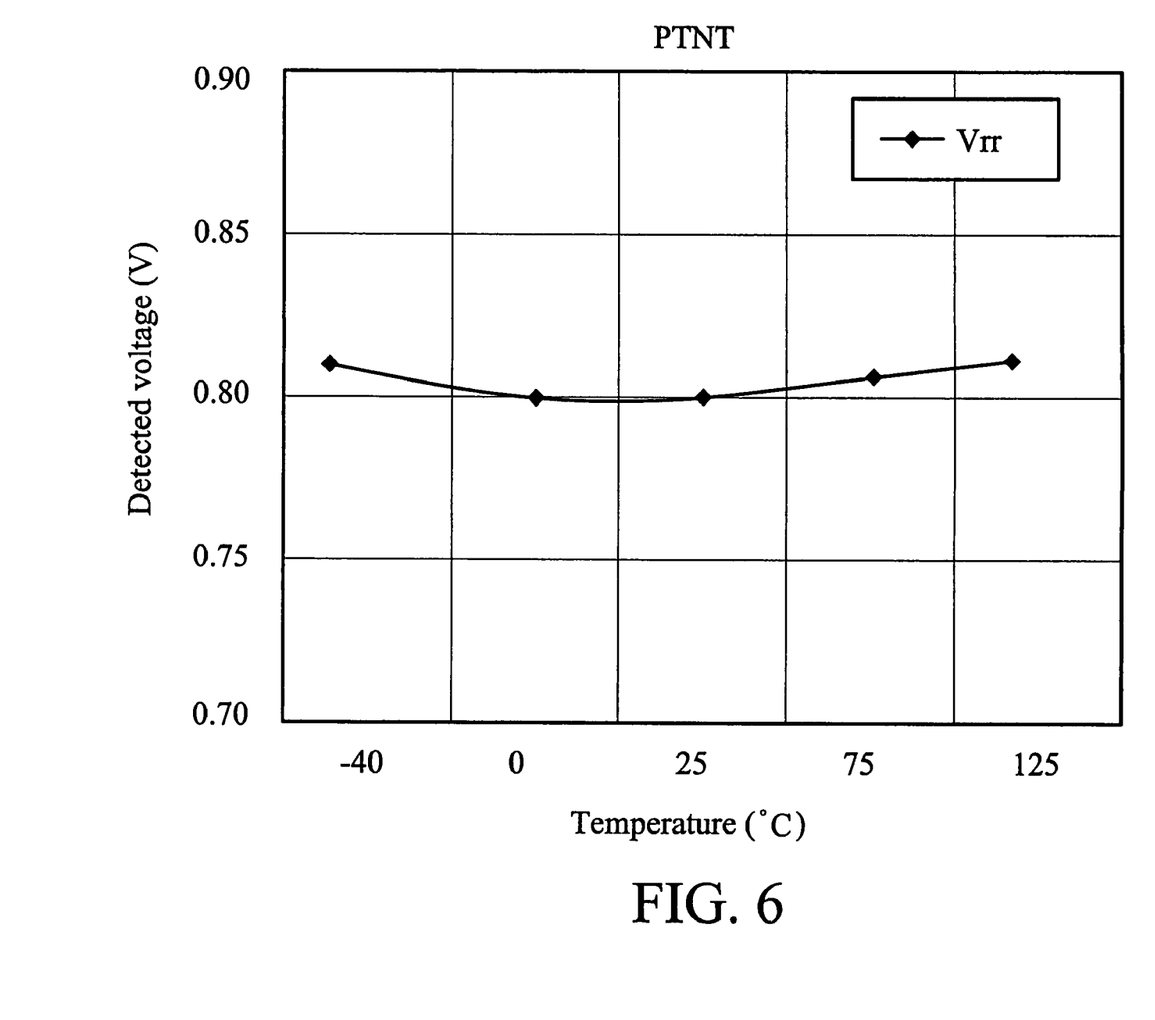
FIG. 6 shows a diagram of detecting voltages in sub-1V versus temperature variations.

In addition, FIG. 6 shows a diagram of detect voltages in sub-1V versus temperature variations. As shown in FIG. 6, the voltage detection circuit according to the embodiments of the present invention are also temperature compensated when the detected voltage $V_{rr}$ is lower than 1V.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A voltage detection circuit for detecting the voltage level of a first power source, the voltage detection circuit comprising:
    a first MOS transistor comprising a first gate, a first source, and a first drain coupled to the first gate;
    a second MOS transistor comprising a second gate, a second source, and a second drain coupled to the second gate;
    a comparator comprising a first input terminal, a second input terminal coupled to the second drain, and an output terminal;
    a first resistor coupled between the first input terminal and the first drain;
    a second resistor coupled to the first power source;
    a third resistor coupled between the second resistor and the first input terminal;
    a fourth resistor coupled between the second resistor and the second input terminal;
    a fifth resistor coupled between a connection point of the first source and the second source, and a second power source; and
    a positive temperature coefficient device coupled to the fifth resistor in parallel, wherein a current passing through the positive temperature coefficient device is increased incrementally as temperature increases.

2. The voltage detection circuit as claimed in claim 1, wherein:
    the first MOS transistor and the second MOS transistor are NMOS transistors;
    the first power source is a high voltage source; and
    the second power source is a low voltage source.

3. The voltage detection circuit as claimed in claim 1, wherein the voltage difference across the first resistor is increased incrementally as temperature increases.

4. The voltage detection circuit as claimed in claim 1, wherein the positive temperature coefficient device is a third MOS transistor comprising a third gate, a third source, and a third drain coupled to the third gate.

5. The voltage detection circuit as claimed in claim 1, wherein the positive temperature coefficient device is an NMOS transistor.

6. The voltage detection circuit as claimed in claim 1, wherein the positive temperature coefficient device is a diode.

7. The voltage detection circuit as claimed in claim 1, wherein the voltage difference across the first drain and the first source of the first MOS transistor is decreased incrementally as temperature increases.

8. The voltage detection circuit as claimed in claim 1, wherein the voltage difference across the second drain and the second source of the second MOS transistor is decreased incrementally as temperature increases.

9. The voltage detection circuit as claimed in claim 1, wherein the voltage difference across the fifth resistor is increased incrementally as temperature increases.

10. The voltage detection circuit as claimed in claim 1, wherein the voltage level of the connection point of the first source and the source is raised incrementally as temperature increases.

* * * * *